United States Patent [19]
Wu et al.

[11] Patent Number: 5,198,682
[45] Date of Patent: Mar. 30, 1993

[54] MULTIPLE QUANTUM WELL SUPERLATTICE INFRARED DETECTOR WITH GRADED CONDUCTIVE BAND

[75] Inventors: Chan-Shin Wu, Torrance; Cheng P. Wen, Mission Viejo, both of Calif.

[73] Assignee: Hughes Aircraft Company, Los Angeles, Calif.

[21] Appl. No.: 792,070

[22] Filed: Nov. 12, 1991

[51] Int. Cl.[5] .......................................... H01L 27/14
[52] U.S. Cl. ..................................... 257/21; 257/186; 257/192; 257/17; 257/185
[58] Field of Search ................. 357/30 E, 16, 4, 90, 357/30 F

[56] References Cited

U.S. PATENT DOCUMENTS

| | | | |
|---|---|---|---|
| 3,721,583 | 3/1973 | Blakeslee | 357/16 X |
| 4,558,336 | 12/1985 | Chang et al. | 357/30 E X |
| 5,023,685 | 6/1991 | Bethea et al. | 357/30 E |

FOREIGN PATENT DOCUMENTS 63-124584  5/1988  Japan ........................................ 357/4

OTHER PUBLICATIONS

Wada et al., "Very High Speed GaInAs Metal-Semiconductor-Metal Photodiode Incorporating an AlInAs/GaInAs Graded Superlattice", *Appl. Phys. Lett.* 54(1), Jan. 2, 1989, pp. 16–17.

Lee et al., "High Quality $In_{0.53}Ga_{0.47}As$ Schottky Diode Formed by Graded Superlattice of $In_{0.53}Ga_{0.47}As/In_{0.52}Al_{0.48}As$", *Appl. Phys. Lett.* 54(19), May 8, 1989, pp. 1863–1865.

*Primary Examiner*—William Mintel
*Attorney, Agent, or Firm*—W. C. Schubert; W. K. Denson-Low

[57] ABSTRACT

A multiple quantum well superlattice radiation detector is compositionally graded to establish an internal electric field within the superlattice that allows the device to operate with a reduced or zero externally applied bias voltage. The compositional grading can be implemented by grading the doping levels of successive quantum wells or the relative proportions of elements in successive barrier layers of the superlattice, or by a combination of the two. If a tunneling current blocking layer is employed, it can also be compositionally graded to inhibit a substantial increase in the blocking layer's barrier energy level near a charge carrier collector on the other side of the blocking layer from the superlattice. The charge carrier collector can itself be provided with a graded dopant concentration near the blocking layer to inhibit reverse bias voltage breakdown in the blocking layer.

21 Claims, 2 Drawing Sheets

MULTIPLE QUANTUM WELL SUPERLATTICE INFRARED DETECTOR WITH GRADED CONDUCTIVE BAND

BACKGROUND OF THE INVENTION

1. Field of the Invention

This invention relates to the detection of electromagnetic radiation with a multiple quantum well (MQW) superlattice structure, and more particularly to the sensing of long wavelength infrared radiation (LWIR) with an MQW superlattice in which photoexcited charge carriers are transported through the superlattice under the influence of an electric field.

2. Description of the Related Art

MQW superlattice LWIR detectors made of heterojunction materials, such as GaAs/Ga$_x$Al$_{1-x}$As, provide good design flexibility for spectral response. The detection of LWIR with an MQW sensor has been reported in several publications, such as Levine et al., "Bound-to-Extended State Absorption GaAs Superlattice Transport Infrared Detectors", *J. Applied Physics Letters*, Vol. 64, No. 3, 1 August 1988, pages 1591–1593; Levine et al., "Broadband 8–12 μm High-Sensitivity GaAs Quantum Well Infrared Photodetector", *Applied Physics Letters*, Vol. 54, No. 26, 26 June 1989, pages 2704–2706; Hasnain et al., "GaAs/AlGaAs Multiquantum Well Infrared Detector Arrays Using Etched Gratings", *Applied Physics Letters*, Vol. 54, No. 25, 19 June 1989, pages 2515–2517; Levine et al., "High-Detectivity D*=1.0×10$^{10}$cm√Hz/W GaAs/AlGaAs Multiquantum Well λ=8.3 μm Infrared Detector", *Applied Physics Letters*, Vol. 53, No. 4, 25 July 1988, pages 296–298.

The principal of operation for an MQW superlattice IR detector is illustrated in FIG. 1. The basic device consists of a periodic heterostructure of GaAs quantum wells and AlGaAs barrier layers 4. The GaAs quantum well layers are doped with an n-type dopant, such as silicon, to provide electrons in the ground states of the wells for intersubband detection. The superlattice is sandwiched between a pair of heavily n-doped GaAs contact layers 6 and 8, with contact layer 6 functioning as an electron emitter and contact layer 8 as an electron collector during sensor operation. Ohmic contacts 10 and 12 on the opposed contact layers provide access to apply a bias voltage across the superlattice.

The thickness of each quantum well layer 2 is sufficiently small, generally about 20–60 Angstroms and most preferably about 40 Angstroms, that quantum effects are significant. The thickness of each barrier layer 4 is generally about 80–300 Angstroms, and most preferably about 140 Angstroms. The superlattice period is thus preferably about 180 Angstroms. It is generally preferred that the layers 2 are heavily doped n-type with a donor impurity such as Ge, S, Si, Sn, Te or Se. A particularly preferred dopant is Si at a concentration of about 1×10$^{18}$–5×10$^{18}$cm$^{-3}$, and most preferably about 5×10$^{18}$cm$^{-3}$. Lattice match and thermal coefficient considerations, impurity concentrations and fabrication techniques are known in the art.

Although a GaAs/AlGaAs superlattice is preferred, other materials may also be used. For example, it may be desirable to use materials such as InGaAs/InAlAs on InP, SiGe on Si, or HgCdTe. In general, superlattices fabricated from III–V, IV—IV and II–VI semiconductor materials are suitable. The MQW superlattice detectors are particularly suited for the detection of LWIR, but the sensors in general are applicable to the detection of radiation and other wavelength regimes, and no limitation to LWIR for the present invention is intended.

As illustrated in FIG. 2, the potential energy barrier height E$_b$ of the barrier layers 4 is about 160 meV above the potential energy barrier height E$_w$ of the quantum wells 2 for GaAs/AlGaAs; E$_f$ identifies the Fermi level. For LWIR with peak detection of about 12 microns, the energy gap between the bound state and the excited state for electrons in the quantum wells is about 100 meV, with the first electron excited state in the quantum wells lying above the conduction band edge of the barrier layers.

Incident infrared photons excite electrons from the quantized baseband 14 of the wells to extended excited states in a continuous conduction subband 16, which has an energy level greater than the conduction band floor for the barrier layers. The excited electrons are then accelerated towards the collector contact 8 by an electric field created by an externally applied bias voltage source V$_b$ (FIG. 1). Under normal sensor operating conditions, the bias voltage causes the mean-free path of electrons in the subband 16 to be sufficiently large for the electrons to travel under the applied field through the superlattice, producing a photocurrent that is measured as an indication of the magnitude of incident radiation. An ammeter 18 can be inserted in the circuit between ohmic layers 10 and 12 for this purpose.

The sensitivity of an MQW superlattice infrared detector can be severely limited by high levels of dark current. This current consists primarily of electrons which tunnel through the intervening barrier layers 4 between the ground states of adjacent quantum wells 2. The tunneling current can be reduced by increasing the widths of the barrier layers 4. However, any such increase in the barrier layer width reduces the device's radiation hardness, which is inversely related to its thickness.

An improvement upon the detector as described thus far is disclosed in co-pending U.S. patent application Ser. No. 07/457,613, filed Dec. 27, 1989 by Sato et al., "Dark Current-Free Multiquantum Well Superlattice Infrared Detector", and assigned to Hughes Aircraft Company, the assignee of the present invention now U.S. Pat. No. 5,077,593 issued Dec. 31, 1991. Under this approach the barrier layers 4 are kept thin, but a thicker (generally about 800–3000 Angstroms) tunneling current blocking layer 20 is provided at the end of the superlattice in the path of the tunneling electrons. The blocking layer 20, which is preferably formed from the same material as the barrier layers 4, eliminates most of the tunneling current component of the photodetector's dark current. This in turn allows the individual barrier layers 4 to be made thinner, thus enhancing the detector's quantum efficiency and increasing its radiation hardness.

Both the conventional MQW superlattice and the improvement offered by Ser. No. 07/457,613 require an external bias voltage to generate photocurrent. Without an applied bias voltage, photoexcited electrons move from their original quantum well regions to adjacent well regions in a random fashion, as indicated by arrows 17 in FIG. 2. As a result, the detector does not exhibit any net photocurrent. A power supply which adds to the cost, weight and bulk of the system is required for operation. This can be particularly undesirable for space applications, in which size and weight are at a premium. The addition of the tunneling current blocking layer 20, while solving the tunneling current problem, actually increases the bias voltage requirements. This is because the blocking layer is fairly high in resistance and carries most of the bias voltage applied across the overall device. The bias voltage must be substantially increased to produce a sufficient voltage differential and electric field across the superlattice. This in turn can lead to a reverse bias voltage breakdown across the blocking layer. Furthermore, it would be desirable to increase the quantum efficiency of both devices.

In an area that is not directly related to MQW superlattice detectors, the bases of heterojunction bipolar transistors (HBTs) have been provided with a graded dopant level or a graded Al content to induce internal fields in the base, and thus reduce the base-transit times of charge carriers. For example, see Kroemer, "Quasi-Electric and Quasi-Magnetic Fields in Nonuniform Semiconductors", RCA Review, Sep. 1957, pages 332-342. However, the principal charge carrier transport through the base of an HBT is quite different from that in an MQW superlattice.

SUMMARY OF THE INVENTION

The present invention seeks to provide an improved MQW superlattice radiation detector that is operable with a reduced bias voltage or even no bias voltage at all, and that exhibits an enhanced quantum efficiency.

These goals are accomplished with an MQW superlattice that is compositionally graded to establish a gradient in the barrier energy levels of its barrier layers. This results in an internal electric field within the superlattice that urges the movement of photoexcited charge carriers through the superlattice, even in the absence of an external bias voltage. The barrier energy level gradient can be established either with a gradient in the dopant concentration of the quantum well layers along the superlattice, or by grading the relative proportions of elements from one barrier layer to the next. With a $GaAs/Al_xGa_{1-a}As$ superlattice, the doping concentrations of the quantum well layers can be increased from about $10^{16}$-$10^{17} cm^{-3}$ on one side of the superlattice to about $10^{18}$-$10^{19} cm^{-3}$ on the other side, or x can be varied from about 0.45 to about 0.15 across the superlattice.

The invention is applicable to a detector that includes a layer of blocking material on one side of the superlattice to block the flow of tunneling current, and a doped collector layer on the opposite side of the blocking layer from the superlattice for collecting photoexcited charge carriers. The portion of the blocking layer proximate to the collector layer is preferably either compositionally graded, or provided with a graded dopant, to inhibit any substantial increase in the blocking layer's barrier energy level near the collector layer. In addition, the dopant concentration in the portion of the collector layer proximate to the blocking layer is preferably reduced so as to substantially reduce the collector layer's electrical resistance. The reduced dopant portion of the collector layer thus carries a substantial portion of a bias voltage applied across the blocking and collector layers, and thereby reduces the portion of the bias voltage available to contribute to voltage breakdown of the blocking layer.

These and other features and advantages of the invention will be apparent to those skilled in the art from the following detailed description, taken together with the accompanying drawings, in which:

DETAILED DESCRIPTION OF THE INVENTION

Figure 1:
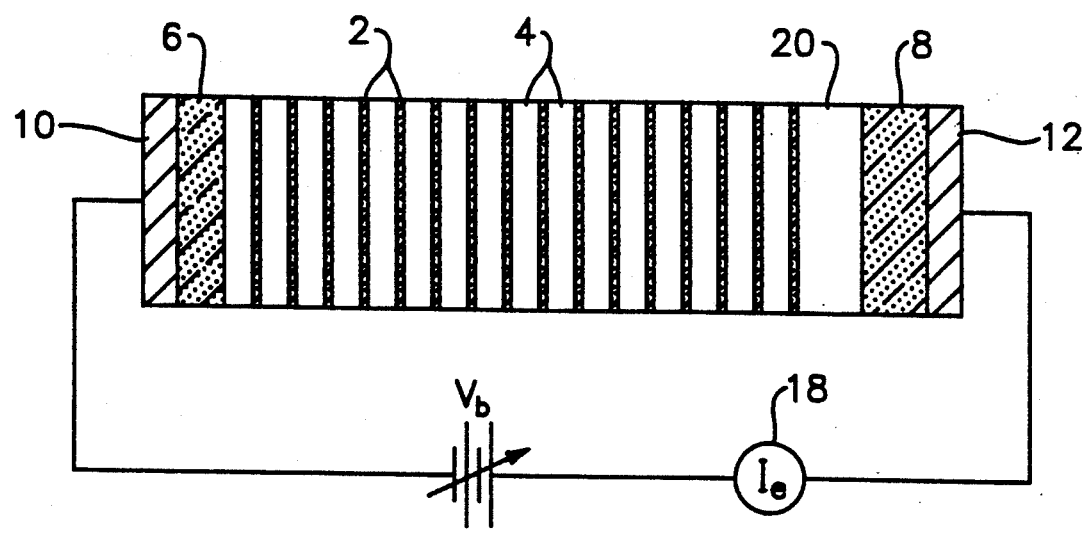
FIG. 1 is a schematic drawing, discussed above, of an MQW superlattice radiation detector instructor in accordance with Ser. No. 07/457,613, U.S. Pat. No. 5,077,593.
Figure 3:
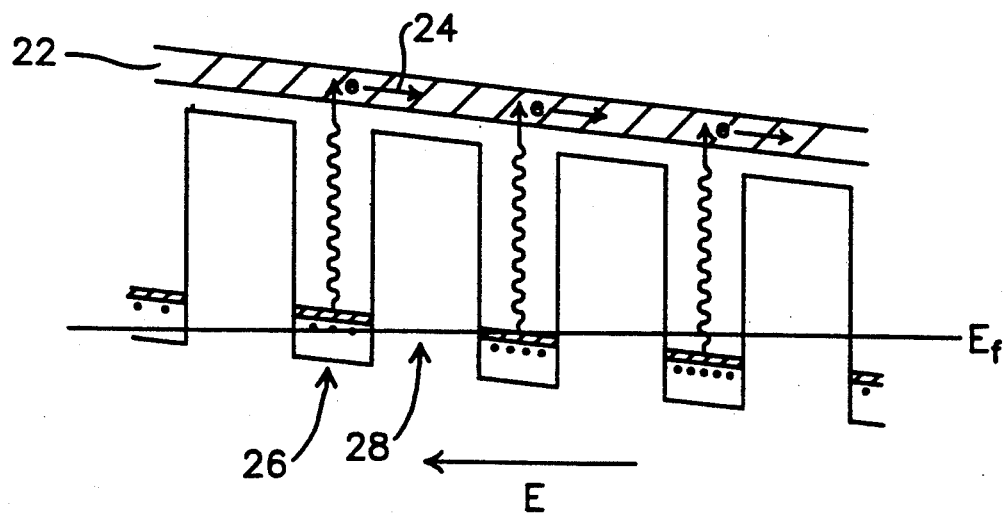
FIG. 3 is an energy diagram for one embodiment of the invention in which the dopant concentrations of the quantum well layers are graded along the superlattice.

An energy diagram is illustrated in FIG. 3 for a new MQW superlattice radiation detector that is characterized by high quantum efficiency, radiation hardness, low noise and cost effectiveness, and is particularly suited for the detection of LWIR. A number of the detectors can be grouped together in a focal plane array. The superlattice is similar in structure to that shown in FIG. 1, but is compositionally graded to establish an internal electric field E. This field urges electrons that have been photoexcited into a continuous conduction subband 22 to move in a common direction within the subband, as indicated by arrows 24. A net photoexcited current flow is thus established through the superlattice in response to incident radiation within the detector's sensitive range, even in the absence of an externally applied bias voltage. This makes the detector photovoltaic; when an externally applied bias voltage is introduced the internal field will add to the externally applied field and increase the electrons' mean free path. The device's quantum efficiency will thus be considerably increased.

Figure 2:
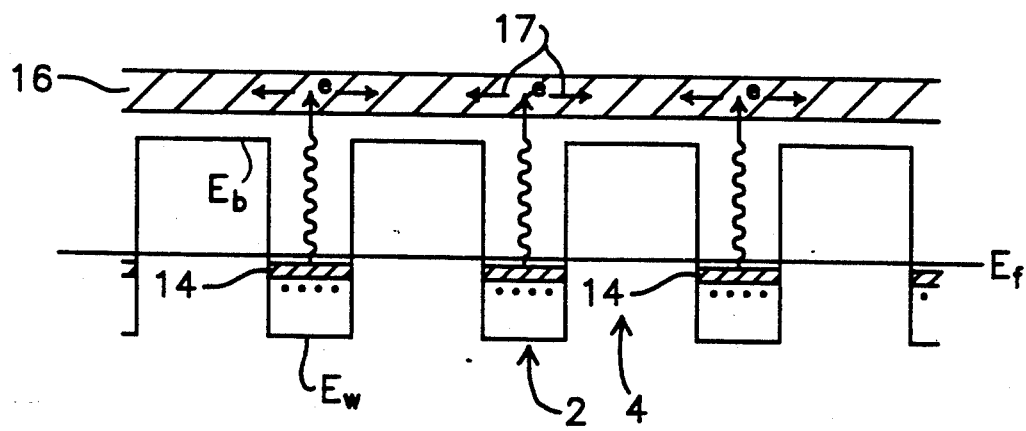
FIG. 2 is an energy diagram, discussed above, of a conventional MQW superlattice radiation detector.

The energy diagram of FIG. 3 is obtained by progressively doping the quantum well layers 26 more heavily in a direction opposite to the direction of the intended electric field E (for n-doped quantum well layers). The dopant grading is not difficult to implement; each quantum well layer 26 is fabricated in turn in a conventional manner, but the doping level is altered for each successive layer. This produces a gradient in the conductive band edges for both the quantum wells and the barrier layers. The composition of the intervening barrier layers 28 can remain the same as in FIG. 2.

The graded dopant density leads to a gradient in the energy of conductive subband 22, as a function of depth within the superlattice. The internal electric field E is equal to the gradient of conduction band energy, and can be expressed as:

$$E = -\frac{kT}{q} \cdot \frac{1}{n} \cdot \frac{dn}{dx},$$

where dn/dx is the doping gradient and T is the ambient temperature.

For a GaAs/AlGaAs MQW superlattice, the dopant gradient can be achieved by grading the concentration of a Si dopant in the $N^+$-GaAs quantum well layers 26. The gradient is preferably linear across the superlattice, and is made as high as feasible. As compared to uniformly doped MQW superlattices with a constant dopant concentration of about $10^{18}/cm^{-3}$, the dopant concentration with the present invention will generally be on the order of $10^{16}$–$10^{17}$ at the lesser doped end of the superlattice, and on the order of $10^{18}$–$10^{19}cm^{-3}$ at the higher doped end of the superlattice.

In addition to transporting photoexcited electrons in a common direction with the internal electric field, the invention also employs another mechanism to increase quantum efficiency. The probability of photoexcited electrons travelling all the way to the electron collector layer 8 at the end of the superlattice varies inversely with the distance of the electrons from the collector layer. Since the highest concentrations of electrons are located nearest the collector layer with the graded doping employed by the invention, a greater percentage of photoexcited electrons will reach the collector layer.

Figure 4:
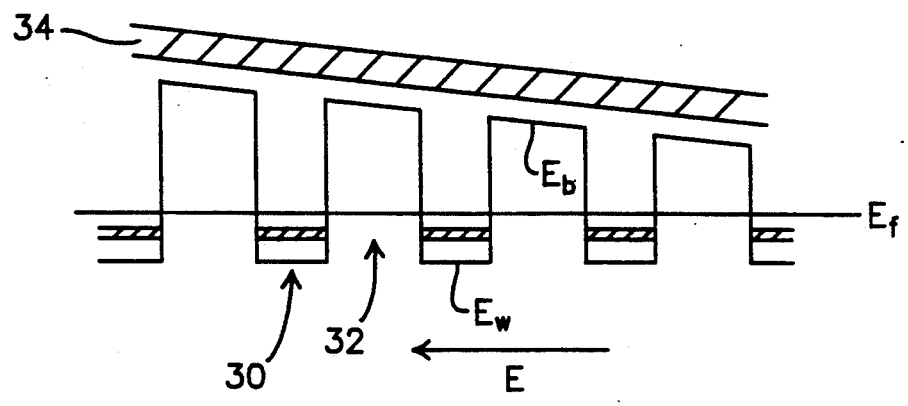
FIG. 4 is an energy diagram for another embodiment of the invention in which the composition of the barrier layers is graded along the superlattice.

An energy diagram that illustrates an alternate way of achieving an internal electric field within the superlattice is given in FIG. 4. In this case the dopant concentrations of the quantum well layers 30 can be kept uniform, while the relative proportions of elements in the barrier layers 32 are graded across the superlattice to progressively alter their energy band gaps. The result is that the conduction band edges $E_w$ for the quantum wells remains constant, while the conductive band edges $E_b$ for the barrier layers progressively drop. As with grading the dopant concentrations of the quantum well layers, the net result is a gradient in the conductive subband 34 and an accompanying internal electric field E.

For barrier layers 32 with the formulation $Al_xGa_{1-x}As$, x would be progressively decreased from left to right to achieve the conduction band edge gradient illustrated in FIG. 4. Typically, x could be reduced from about 0.45 at the left end of the superlattice to about 0.15 at the right end.

A desired internal electric field can be established with either a gradient in the quantum well doping, a gradient in the barrier layer composition, or with a combination of the two. Grading the doping level of the quantum wells is generally preferable, since it is easy to control and the detector's spectral response is not affected by the graded doping level. By contrast, grading the Al:Ga ratio in the barrier layers affects the detector's spectral response. The barrier height increases and the superlattice responds to a shorter wavelength as the proportion of Al goes up. Since the sprectral response varies over the superlattice, the detector will have a broad band sensitivity. The thicknesses of the quantum wells with larger barrier heights should be reduced to keep the conductive subband 34 above the barrier heights. Compositional grading of the barrier layers may be preferable for very low temperature operation, since it is relatively insensitive to temperature. The effect of grading the dopant levels in the quantum wells is reduced at low temperatures.

Figure 5:
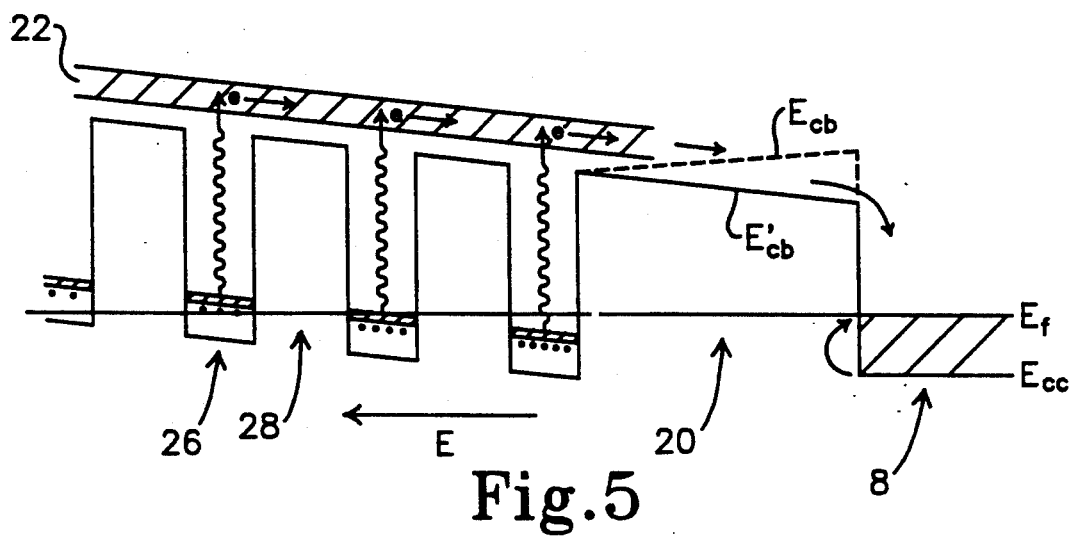
FIG. 5 is an energy diagram for a third embodiment of the invention in which a tunneling current blocking layer is compositionally graded.

When a tunneling current blocking layer 20 is added at one end of the superlattice, it will generally be desirable to also compositionally grade the blocking layer when the invention is used to establish an internal electric field within the superlattice. This is because, as illustrated in FIG. 5, the conductive band edge $E_{cc}$ of the collector layer 8 tends to line up with the Fermi level $E_f$. As a result, the blocking layer's conductive band edge $E_{cb}$ tends to be pushed up as it approaches the collector layer 8. With this elevated $E_{cb}$ the electrons travelling in the conductive miniband 22 may not have enough energy to travel all the way through the blocking layer 20. To resolve this problem, the portion of the blocking layer 20 that is proximate to the collector layer 8 is preferably compositionally graded to reduce $E_{cb}$ in this region, so that it no longer blocks the flow of photoexcited electrons through the blocking layer. The reduced conductive band edge for the blocking layer is indicated in FIG. 5 as $E'_{cb}$.

The blocking layer's compositional grading can be implemented by grading a dopant in, or grading the relative proportions of elements constituting, the portion of the blocking layer proximate to the collector layer. When a dopant is used, it should be grown only in the portion of the blocking layer near the collector layer, with the rest of the blocking layer remaining intrinsic. Where $Al_xGa_{1-x}As$ is employed for the blocking layer, x can typically be increased on the order of about 50 percent from the collector side to the superlattice side of the blocking layer. For example, x might increase from about 10 percent to about 15 percent, or from about 17 percent to about 25 percent. The blocking layer grading is preferably selected to hold the barrier energy height across the blocking layer approximately constant.

Figure 6:
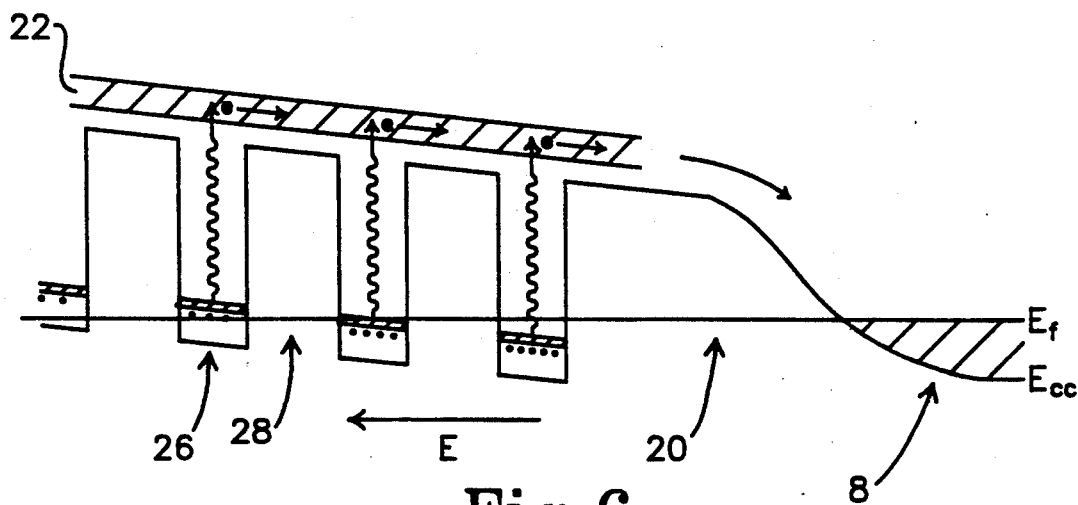
FIG. 6 is an energy diagram for a fourth embodiment of the invention in which a collector layer for photoexcited charge carriers is compositionally graded.

Another potential problem with the use of a tunneling current blocking layer 20 is that, because the blocking layer takes the bulk of a bias voltage applied across the detector, it may be subject to reverse bias voltage breakdown. A solution to this problem, illustrated in FIG. 6, involves a graded doping of the collector layer 8 in the region proximate to the blocking layer 20. By reducing the doping concentration of the collector layer in this region, the collector layer's resistance in the region is increased and some of the externally applied bias voltage will be shifted to it from the blocking layer. The graded doping is reflected by a progressive increase in $E_{cc}$ as the blocking layer is approached. As an example, with an AlGaAs collector layer that is about 1 micron wide overall, about 0.1 micron adjacent the blocking layer could have the doping gradient. The doping level could typically be reduced from about $5 \times 10^{17}cm^{-3}$ in the main body of the collector, to about $1-5 \times 10^{17}cm^{-3}$ adjacent the blocking layer.

Various embodiments of an MQW superlattice radiation detector with improved quantum efficiency, reduced or zero bias voltage requirements, radiation hardness and high reliability have thus been shown and described. Numerous variations and alternate embodiments will occur to those skilled in the art. For example, while a specific example of an MQW with n-doped quantum well layers has been discussed, the invention is also applicable to MQWs with p-doped quantum wells, and the superlattice compositional grading can be used whether or not the detector employs a tunneling current blocking layer. Accordingly, it is intended that the invention be limited only in terms of the appended claims.

I claim:

1. A radiation sensitive multiple quantum well (MQW) superlattice structure, comprising:
   a set of doped quantum well layers,
   a set of barrier layers interleaved with said quantum well layers and having a different composition than said quantum well layers to form a periodic heterostructure therewith, said barrier layers characterized by respective barrier energy levels, said quantum well layers having a gradient in dopant concentration across the superlattice to establish an internal electric field within the superlattice, whereby charge carriers that are photoexcited by radiation are biased to move across said superlattice.

2. A radiation sensitive multiple quantum well (MQW) superlattice structure, comprising:
a set of doped quantum well layers,
a set of barrier layers comprised of a multielement compound, interleaved with said quantum well layers and characterized by respective barrier energy levels, wherein relative proportions of elements within said compound are graded along the superlattice to produce a barrier energy level gradient and an internal electric field within the superlattice, whereby charge carriers that are photoexcited by radiation are biased to move across said superlattice.

3. The MQW superlattice structure of claim 1, further comprising a layer of blocking material on one side of said superlattice to block the flow of tunneling current from the superlattice, and a doped collector layer on the opposite side of said blocking layer from the superlattice for collecting photoexcited charge charriers flowing through the blocking layer from the superlattice, wherein a portion of said blocking layer proximate to said collector layer is compositionally graded to inhibit a substantial increase in the barrier energy level of said blocking layer proximate to said collector layer, relative to the barrier energy level of said blocking layer proximate to said superlattice.

4. The MQW superlattice structure of claim 3, said blocking layer comprising a multi-element compound, wherein said portion of said blocking layer proximate to said collector layer is compositionally graded to inhibit said substantial increase in barrier energy level by varying relative proportions of elements in said compound along said portion.

5. The MQW superlattice structure of claim 3, wherein said blocking layer is provided with a graded dopant proximate to said collector layer to inhibit said substantial increase in barrier energy level, the other portions of said blocking layer being generally intrinsic.

6. The MQW superlattice structure of claim 1, further comprising a layer of blocking material on one side of said superlattice to block to flow of tunnelling current from the superlattice, and a doped collector layer on the opposite side of said blocking layer from the superlattice for collecting photoexcited charge carriers flowing through the blocking layer from the superlattice, wherein the dopant concentration in the portion of said collector layer proximate to said blocking layer is reduced relative to the dopant concentration in the remainder of said collector layer to substantially increase electrical resistance of a portion of said collector layer proximate to said blocking layer relative to the remainder of the collector layer, said reduced dopant portion of the collector layer carrying a substantial portion of a bias voltage applied across said blocking and collector layers and thereby reducing the portion of said bias voltage that is available to contribute to voltage breakdown of said blocking layer.

7. A radiation sensitive multiple quantum well (MQW) superlattice structure, comprising:
a plurality of doped quantum well layers characterized by respective ground state energy levels, and
a plurality of barrier layers interleaved with said quantum well layers and having a different composition than said quantum well layers to form a periodic heterostructure therewith, said barrier layers characterized by respective barrier energy levels,
dopant concentration of said quantum well layers progressively increasing in one direction along said superlattice to establish a gradient along the superlattice in the barrier energy levels of said barrier layers, with a generally constant differential along the superlattice between the ground state energy levels of said quantum well layers and the barrier energy levels of the adjacent barrier layers, and to establish an accompanying internal electric field within the superlattice, whereby charge carriers from said quantum well layers that are photoexcited by radiation are biased to move across the superlattice.

8. The MQW superlattice structure of claim 7, said quantum well layers comprising n-doped GaAs, said barrier layers comprising AlGaAs, and the doping concentrations of said quantum well layers increasing from about $10^{16}$–$10^{17}$ cm$^{-3}$ on one side of the superlattice to about $10^{18}$–$10^{19}$ cm$^{-3}$ on the other side of the superlattice.

9. A radiation sensitive multiple quantum well (MQW) superlattice structure, comprising:
a plurality of doped quantum well layers characterized by respective ground state energy levels, and
a plurality of barrier layers interleaved with said quantum well layers and characterized by respective barrier energy levels,
said barrier layers comprising a multi-element compound wherein the relative proportions of elements is progressively altered among said barrier layers in one direction along said superlattice to establish a gradient along the superlattice in the barrier energy levels of said barrier layers, with a progressively graded differential along the superlattice between the ground state energy levels of said quantum well layers and the barrier energy levels of the adjacent barrier layers, and to establish an accompanying internal electric field within the superlattice, whereby charge carriers from said quantum well layers that are photoexcited by radiation are biased to move across the superlattice.

10. The MQW superlattice structure of claim 9, said quantum well layers comprising n-doped GaAs, said barrier layers comprising $Al_xGa_{1-x}As$, wherein x progressively varies from the order of 0.45 to the order of 0.15 across the superlattice.

11. A multiple quantum well (MQW) superlattice radiation sensor, comprising:
an MQW superlattice of alternating barrier layers and doped quantum well layers,
a layer of blocking material on one side of said superlattice to block the flow of tunneling current from the superlattice, and
a doped collector layer on the opposite side of said blocking layer from the superlattice for collecting photoexcited charge carriers flowing through the blocking layer from the superlattice, wherein a portion of said blocking layer proximate to said collector layer is compositionally graded to inhibit a substantial increase in the barrier energy level of said blocking layer proximate to said collector layer, relative to its barrier energy level proximate to said superlattice.

12. The MQW superlattice radiation sensor of claim 11, said blocking layer comprising a multi-element compound, wherein the relative proportions of elements within said compound proximate to said collector layer are graded to inhibit said substantial increase in barrier energy level.

13. The MQW superlattice radiation sensor of claim 12, said blocking layer comprising $Al_xGa_{1-x}As$, wherein x progressively increases on the order of about 50% from the side of the blocking layer proximate to said collector layer to the side of the blocking layer proximate to the superlattice.

14. The MQW superlattice radiation sensor of claim 11, wherein said blocking layer is provided with a graded dopant proximate to said collector layer to inhibit said substantial increase in barrier energy level, the other portions of said blocking layer being generally intrinsic.

15. A multiple quantum well (MQW) superlattice radiation sensor, comprising:
an MQW superlattice of alternating barrier layers and doped quantum well layers,
a layer of blocking material on one side of said superlattice to block the flow of tunnelling current from the superlattice, and
a doped collector layer on the opposite side of said blocking layer from the superlattice for collecting photoexcited charge carriers flowing through the blocking layer from the superlattice, wherein dopant concentration in the portion of said collector layer proximate to said blocking layer is progressively graded to a lower level in the direction of said blocking layer relative to dopant concentration in the remainder of said collector layer to substantially increase its electrical resistance relative to the remainder of the collector layer, said progressively graded dopant portion of the collector layer carrying a substantial portion of a bias voltage applied across said blocking and collector layers and thereby reducing the portion of said bias voltage that is available to contribute to voltage breakdown of said blocking layer.

16. The MQW superlattice radiation sensor of claim 15, wherein said collector layer dopant concentration is graded from about $10^{18}$–$10^{19}$ cm$^{-3}$ to about $1$–$5 \times 10^{17}$ cm$^{-3}$.

17. The MQW superlattice radiation sensor of claim 15, wherein said collector layer has a width and the progressively graded dopant concentration portion of said collector layer extends along said width on the order of 10% of said width.

18. The MQW superlattice structure of claim 2, further comprising a layer of blocking material on one side of said superlattice to block the flow of tunneling current from the superlattice, and a doped collector layer on the opposite side of said blocking layer from the superlattice for collecting photoexcited charge charriers flowing through the blocking layer from the superlattice, wherein a portion of said blocking layer proximate to said collector layer is compositionally graded to inhibit a substantial increase in the barrier energy level of said blocking layer proximate to said collector layer, relative to the barrier energy level of said blocking layer proximate to said superlattice.

19. The MQW superlattice structure of claim 18, said blocking layer comprising a multi-element compound, wherein said portion of said blocking layer proximate to said collector layer is compositionally graded to inhibit said substantial increase in barrier energy level by varying relative proportions of elements in said compound along said portion.

20. The MQW superlattice structure of claim 18, wherein said blocking layer is provided with a graded dopant proximate to said collector layer to inhibit said substantial increase in barrier energy level, the other portions of said blocking layer being generally intrinsic.

21. The MQW superlattice structure of claim 2, further comprising a layer of blocking material on one side of said superlattice to block the flow of tunnelling current from the superlattice, and a doped collector layer on the opposite side of said blocking layer from the superlattice for collecting photoexcited charge carriers flowing through the blocking layer from the superlattice, wherein dopant concentration in the portion of said collector layer proximate to said blocking layer is reduced relative to dopant concentration in the remainder of said collector layer to substantially increase electrical resistance of a portion of said collector layer proximate to said blocking layer relative to the remainder of the collector layer, said reduced dopant portion of the collector layer carrying a substantial portion of a bias voltage applied across said blocking and collector layers and thereby reducing the portion of said bias voltage that is available to contribute to voltage breakdown of said blocking layer.

* * * * *